(12) United States Patent
Chen

(10) Patent No.: US 10,644,040 B2
(45) Date of Patent: May 5, 2020

(54) ARRAY SUBSTRATE, MANUFACTURING METHOD THEREOF, AND DISPLAY PANEL

(71) Applicant: Wuhan China Star Optoelectronics Technology Co., Ltd., Wuhan, Hubei (CN)

(72) Inventor: Chen Chen, Guangdong (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 0 days.

(21) Appl. No.: 16/044,948

(22) Filed: Jul. 25, 2018

(65) Prior Publication Data

US 2019/0267408 A1   Aug. 29, 2019

Related U.S. Application Data

(63) Continuation of application No. PCT/CN2018/082797, filed on Apr. 12, 2018.

(30) Foreign Application Priority Data

Feb. 26, 2018 (CN) .......................... 2018 1 0163135

(51) Int. Cl.
*H01L 27/12* (2006.01)
*H01L 29/417* (2006.01)
*H01L 29/786* (2006.01)

(52) U.S. Cl.
CPC ...... *H01L 27/1248* (2013.01); *H01L 27/1218* (2013.01); *H01L 27/1259* (2013.01);
(Continued)

(58) Field of Classification Search
CPC ........... H01L 27/1248; H01L 29/78633; H01L 29/41733; H01L 27/1262; H01L 27/1218; G02F 2201/123; G02F 2201/121
See application file for complete search history.

(56) References Cited

U.S. PATENT DOCUMENTS

2015/0262536 A1* 9/2015 Chen ..................... G09G 3/36
                                                                  345/92
2016/0223855 A1    8/2016 Kobayashi
(Continued)

FOREIGN PATENT DOCUMENTS

CN       104062821 A       9/2014
CN       105278172 A       1/2016
(Continued)

OTHER PUBLICATIONS

International search report dated Nov. 23, 2018 from corresponding application No. PCT/CN2018/082797.

*Primary Examiner* — Syed I Gheyas
(74) *Attorney, Agent, or Firm* — Leong C. Lei

(57) ABSTRACT

The present invention discloses an array substrate for forming a display panel, comprising: a substrate; a thin-film transistor disposed on the substrate, the thin-film transistor comprising a drain electrode; a planarization layer disposed on the thin-film transistor, the planarization layer being provided with a first via hole for exposing the drain electrode; a pixel electrode layer disposed on the surface of the planarization layer away from the substrate, the pixel electrode layer covering the first via hole and being in contact with the drain electrode; and a photoresist layer covering the pixel electrode layer, and the photoresist layer filling the first via hole which is covered with the pixel electrode layer. The present invention solves the issues caused by the height difference in products.

10 Claims, 2 Drawing Sheets

(52) U.S. Cl.
CPC .... *H01L 27/1262* (2013.01); *H01L 29/41733* (2013.01); *H01L 29/78633* (2013.01); *H01L 29/78675* (2013.01); *G02F 2201/121* (2013.01); *G02F 2201/123* (2013.01)

(56) References Cited

U.S. PATENT DOCUMENTS

| | | | | |
|---|---|---|---|---|
| 2017/0212379 | A1* | 7/2017 | Miyakawa | G02F 1/133345 |
| 2017/0293174 | A1* | 10/2017 | Tai | G02F 1/1368 |
| 2017/0307920 | A1* | 10/2017 | Chung | G02F 1/1368 |
| 2018/0217421 | A1* | 8/2018 | Chen | H01L 29/786 |
| 2018/0329248 | A1* | 11/2018 | Cho | G02F 1/13318 |

FOREIGN PATENT DOCUMENTS

| | | | |
|---|---|---|---|
| CN | 106468836 A | | 3/2017 |
| CN | 106909001 A | | 6/2017 |
| CN | 107505786 A | * | 12/2017 |
| CN | 107505786 A | | 12/2017 |

\* cited by examiner

ARRAY SUBSTRATE, MANUFACTURING METHOD THEREOF, AND DISPLAY PANEL

RELATED APPLICATION

This application is a continuing application of PCT Patent Application No. PCT/CN2018/082797 entitled "ARRAY SUBSTRATE, MANUFACTURING METHOD THEREOF, AND DISPLAY PANEL", filed on Apr. 12, 2018, which claims priority to Chinese Patent Application No. 201810163135.8, filed on Feb. 26, 2018, both of which are hereby incorporated in its entireties by reference.

FIELD OF THE INVENTION

The present invention relates to a display technology field, in particular to an array substrate, a manufacturing method thereof, and a display panel.

BACKGROUND OF THE INVENTION

In the manufacture of display panels, the low temperature polysilicon technology provides the advantages of the low cost of manufactured products and the high electron mobility of devices, thereby increasingly becoming favored by manufacturers such as mobile phones and tablet's screens. However, because the use of low temperature polysilicon technology requires many layers of film and the structure of the layers of film is complex, the thin-film transistor array panel has significant difference in product height after the accumulation of several layers of film. In the subsequent cell process, it is likely to have a great impact on the alignment of the liquid crystals, which in turn causes product defects.

SUMMARY OF THE INVENTION

The present invention provides an array substrate, a manufacturing method thereof, and a display panel to solve the product defect issues caused by the height difference in products.

The present invention provides an array substrate for forming a display panel, which comprises:
a substrate;
a thin-film transistor disposed on the substrate, the thin-film transistor comprising a drain electrode;
a planarization layer disposed on the thin-film transistor, the planarization layer being provided with a first via hole for exposing the drain electrode;
a pixel electrode layer disposed on the surface of the planarization layer away from the substrate, the pixel electrode layer covering the first via hole and being in contact with the drain electrode; and
a photoresist layer covering the pixel electrode layer, and the photoresist layer filling the first via hole which is covered with the pixel electrode layer.

The array substrate disclosed herein may further comprise a photoresist column disposed on the photoresist layer and the photoresist column is used to support the display panel.

The thin-film transistor disclosed herein may comprise a light shielding layer disposed on the substrate, a buffer layer covering the light shielding layer, a polysilicon layer disposed on the buffer layer, and a dielectric insulating layer covering the polysilicon layer, and the dielectric insulating layer is provided with a second via hole and a third via hole, which are arranged at intervals and expose a portion of the surface of the polysilicon layer, wherein the thin-film transistor further comprises a source electrode, and the source electrode and the drain electrode are disposed on the dielectric insulating layer, and the drain electrode is in contact with the polysilicon layer through the second via hole, and the source electrode is in contact with the polysilicon layer through the third via hole, wherein the planarization layer is disposed on the source electrode, the drain electrode and the dielectric insulating layer.

The dielectric insulating layer disclosed herein may comprise an insulating layer and a dielectric layer stacked on the insulating layer, wherein the thin-film transistor comprises a gate electrode, the gate electrode is disposed on the insulating layer, and the dielectric layer covers the gate electrode.

The array substrate disclosed herein may further comprise a common electrode layer disposed on the planarization layer and a passivation layer disposed on the common electrode layer, and the passivation layer covers the common electrode layer and the side wall of the first via hole, wherein the pixel electrode layer is disposed on the passivation layer and covers the passivation layer, and the pixel electrode layer is in contact with the drain electrode through the first via hole.

The present invention provides a display panel comprising the aforementioned array substrate.

The present invention provides a method for manufacturing an array substrate, which comprises:
providing a substrate;
forming a thin-film transistor on the substrate;
forming a planarization layer on the thin-film transistor;
forming a first via hole in the planarization layer, the first via hole exposing a drain electrode of the thin-film transistor;
forming a pixel electrode layer on the surface of the planarization layer away from the substrate, the pixel electrode layer covering the first via hole and being in contact with the drain electrode; and
forming a photoresist layer on the pixel electrode layer, the photoresist layer covering the pixel electrode layer, and the photoresist layer filling the first via hole which is covered with the pixel electrode layer.

The step of forming a thin-film transistor on the substrate disclosed herein may comprise;
forming a light shielding layer on the substrate;
forming a buffer layer on the light shielding layer, and buffer layer covering the light shielding layer;
forming a polysilicon layer on the buffer layer;
forming a dielectric insulating layer on the polysilicon layer, the dielectric insulating layer covering the polysilicon layer; forming a second via hole and a third via hole in the dielectric insulating layer, the second via hole and the third via hole being arranged at intervals and exposing a portion of the surface of the polysilicon layer;
forming a source electrode and a drain electrode on the dielectric insulating layer, the drain electrode being in contact with the polysilicon layer through the second via hole, and the source electrode being in contact with the polysilicon layer through the third via hole.

The step of forming a pixel electrode layer on the surface of the planarization layer away from the substrate disclosed herein may comprise:
forming a common electrode layer on the planarization layer;
forming a passivation layer on the common electrode layer, and the passivation layer covering the common electrode layer and the side wall of the first via hole;

forming a pixel electrode layer on the passivation layer, and the pixel electrode layer covering the passivation layer and being in contact with the drain electrode through the first via hole.

After the step of forming a photoresist layer on the pixel electrode layer, the method disclosed herein may further comprise:

forming a photoresist column on the photoresist layer.

In summary, the photoresist layer fills the first via hole which is covered with the pixel electrode layer, realizing the planarization of the array substrate, thereby solving the technical problems that impact on the alignment of the liquid crystals in the subsequent cell process caused by significant difference in product height, and improving the product's yield and competitiveness.

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other figures according to these figures without paying the premise.

DETAILED DESCRIPTION OF PREFERRED EMBODIMENTS

Figure 1:
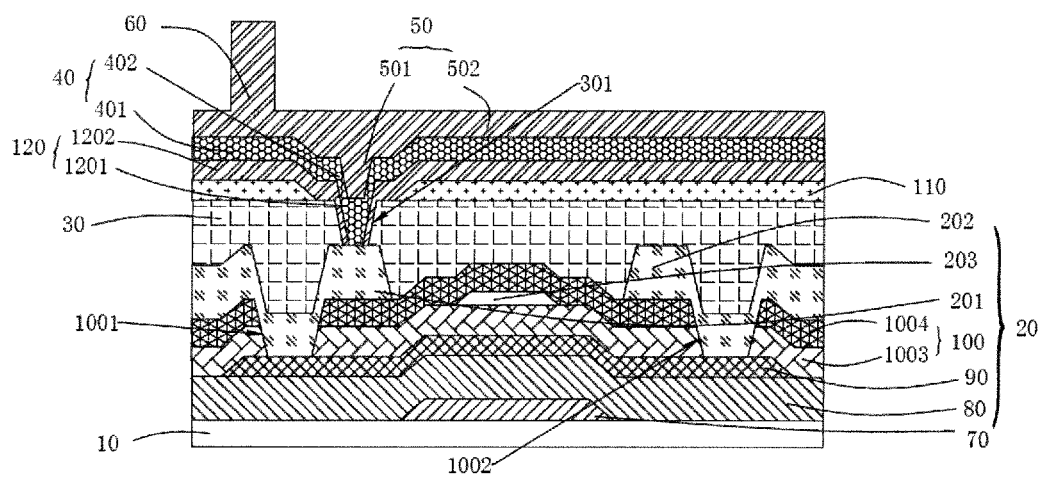
FIG. 1 is a schematic view illustrating an array substrate according to some embodiments of the present invention.

Referring to FIG. 1, the present invention provides an array substrate for forming a display panel, which comprises: a substrate 10; a thin-film transistor 20 disposed on the substrate 10, the thin-film transistor 20 comprising a drain electrode 201; a planarization layer 30 disposed on the thin-film transistor 20, the planarization layer 30 being provided with a first via hole 301 for exposing the drain electrode 201; a pixel electrode layer 40 disposed on the surface of the planarization layer 30 away from the substrate 10, the pixel electrode layer 40 covering the first via hole 301 and being in contact with the drain electrode 201; and a photoresist layer 50 covering the pixel electrode layer 40, and the photoresist layer 50 filling the first via hole 301 which is covered with the pixel electrode layer 40.

The photoresist layer 50 of the present invention fills the first via hole 301 which is covered with the pixel electrode layer 40, realizing the planarization of the array substrate, thereby solving the technical problems that impact on the alignment of the liquid crystals in the subsequent cell process caused by significant difference in product height, and improving the product's yield and competitiveness.

Specifically, the photoresist layer 50 comprises a first sub-photoresist layer 501 and a second sub-photoresist layer 502 connected to the first-sub photoresist layer 501. The first sub-photoresist layer 501 fills in the first via hole 301 which is covered with the pixel electrode layer 40. The pixel electrode layer 40 comprises a first sub-pixel electrode layer 401 and a second sub-pixel electrode layer 402 connected to the first sub-pixel electrode layer 401, the first sub-pixel electrode layer 401 is disposed in the first via hole 301 and connected to the drain electrode 201, the second sub-pixel electrode layer 402 is covered by the second sub-photoresist layer 502. Because the planarization 30 is thick, the depth of the first via hole 301 is large, the thickness of the pixel electrode layer 40 is relatively thin, even if the first sub-pixel electrode layer 401 is disposed in the first via hole 301, the first sub-pixel electrode layer 401 cannot fill up the first via hole 301. But the first sub-photoresist layer 501 fills the first via hole 301 which is covered with the pixel electrode layer 40, realizing the planarization of the array substrate, thereby improving the product's yield and competitiveness.

In some embodiments, the array substrate further comprises a photoresist column 60 disposed on the photoresist layer 50, and the photoresist column 60 is used to support the display panel. In this embodiment, the photoresist layer 50 is made together with the photoresist column 60. The photoresist column 60 on the photoresist layer 50 can provide a space for the subsequent cell process and support the display panel.

In this embodiment, the thin-film transistor 20 comprises a light shielding layer 70 disposed on the substrate 10, a buffer layer 80 covering the light shielding layer 70, a polysilicon layer 90 disposed on the buffer layer 80, and a dielectric insulating layer 100 covering the polysilicon layer 90. The dielectric insulating layer 100 is provided with a second via hole 1001 and a third via hole 1002, which are arranged at intervals and expose a portion of the surface of the polysilicon layer 90. The thin-film transistor 20 further comprises a source electrode 202, and the source electrode 202 and the drain electrode 201 are disposed on the dielectric insulating layer 100. The drain electrode 201 is in contact with the polysilicon layer 90 through the second via hole 1001, and the source electrode 202 is in contact with the polysilicon layer 90 through the third via hole 1002. The planarization layer 30 is disposed on the source electrode 201, the drain electrode 202 and the dielectric insulating layer 100.

In this embodiment, the dielectric insulating layer 100 comprises an insulating layer 1003 and a dielectric layer 1004 stacked on the insulating layer 1003. The thin-film transistor 20 comprises a gate electrode 203, the gate electrode 203 is disposed on the insulating layer 1003, and the dielectric layer 1004 covers the gate electrode 203.

In some embodiments, the array substrate further comprises a common electrode layer 110 disposed on the planarization layer 30 and a passivation layer 120 disposed on the common electrode layer 110, the passivation layer covers the common electrode layer 110 and the side wall of the first via hole 301. Specifically, the passivation layer 120 comprises a first sub-passivation layer 1201 and a second sub-passivation layer 1202 connected to the first sub-passivation layer 1201, the second sub-passivation layer 1202 covers the common electrode layer 110, the first sub-passivation layer 1201 extends into the first via hole 301 and covers the side wall of the first via hole 301. The pixel electrode layer 40 is disposed on the passivation layer 120 and covers the passivation layer 120, and the pixel electrode layer 40 is in contact with the drain electrode 201 through the first via hole 301. In this embodiment, the second sub-pixel electrode layer 402 covers the passivation layer 120.

Figure 2:
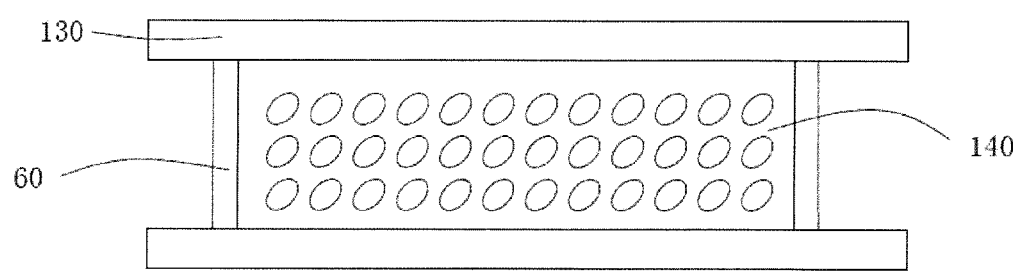
FIG. 2 is a schematic view illustrating a display panel according to some embodiments of the present invention.

Referring to FIG. 2, the present invention provides a display panel, comprising the aforementioned array substrate, a color filter substrate 130 and a liquid crystal molecular layer 140. The color filter substrate 130 is disposed on the photoresist column 60. The array substrate, the photoresist column 60 and the color filter substrate 130 form a filling space, and the liquid crystal molecular layer 140 is disposed in the filling space. The liquid crystal molecular layer 140 can control the brightness of light emitted from the display panel by twisting. The color filter substrate 130 combined with the liquid crystal molecular layer 140 can adjust the brightness of the three primary colors to obtain a desired color display. The display panel of the present invention transfers the photoresist column 60 in the color filter substrate 130 to the array substrate without increasing the cost of the display panel. The photoresist column 60 and the photoresist layer 50 that are made together not only realize the planarization of the array substrate, thereby solving the technical problems that impact on the alignment of the liquid crystals in the subsequent cell process caused by significant difference in product height, and improving the product's yield and competitiveness, but also provide a space for the subsequent cell process and support the display panel.

The present invention provides a method for manufacturing an array substrate, which comprises:

S01, providing a substrate 10;

S02, forming a thin-film transistor 20 on the substrate 10;

S03, forming a planarization layer 30 on the thin-film transistor 20;

S04, forming a first via hole 301 in the planarization layer 30, the first via hole 301 exposing a drain electrode 20 of the thin-film transistor 20;

S05, forming a pixel electrode layer 40 on the surface of the planarization layer 30 away from the substrate 10, the pixel electrode layer 40 covering the first via hole 301 and being in contact with the drain electrode 201; and S06, forming a photoresist layer 50 on the pixel electrode layer 40, the photoresist layer 50 covering the pixel electrode layer 40, and the photoresist layer 50 filling the first via hole 301 which is covered with the pixel electrode layer 40.

Further, the step of forming a thin-film transistor 20 on the substrate 10 comprises:

forming a light shielding layer 70 on the substrate 10;

forming a buffer layer 80 on the light shielding layer 70, and buffer layer 80 covering the light shielding layer 70;

forming a polysilicon layer 90 on the buffer layer 80;

forming a dielectric insulating layer 100 on the polysilicon layer 90, the dielectric insulating layer 100 covering the polysilicon layer 90; forming a second via hole 1001 and a third via hole 1002 in the dielectric insulating layer 100, the second via hole 1001 and the third via hole 1002 being arranged at intervals and exposing a portion of the surface of the polysilicon layer 90, wherein the dielectric insulating layer 100 comprises an insulating layer 1003 and a dielectric layer 1004 stacked on the insulating layer 1003, and the thin-film transistor 20 comprises a gate electrode 203, and the gate electrode 203 is disposed on the insulating layer 1003, and the dielectric layer 1004 covers the gate electrode 203;

forming a source electrode 202 and a drain electrode 201 on the dielectric insulating layer 100, the drain electrode 201 being in contact with the polysilicon layer 90 through the second via hole 1002, and the source electrode 201 being in contact with the polysilicon layer 90 through the third via hole 1002, wherein the planarization layer 30 is disposed on the source electrode 201, the drain electrode 202 and the dielectric insulating layer 100.

Further, the step of forming a pixel electrode layer 40 on the surface of the planarization layer 30 away from the substrate 10 comprises:

forming a common electrode layer 110 on the planarization layer 30;

forming a passivation layer 120 on the common electrode layer 110, and the passivation layer 120 covering the common electrode layer 110 and the side wall of the first via hole 301;

forming a pixel electrode layer 40 on the passivation layer 120, and the pixel electrode layer 40 covering the passivation layer 120 and being in contact with the drain electrode 201 through the first via hole 301.

Further, after the step of forming a photoresist layer 50 on the pixel electrode layer 40, the method further comprises;

forming a photoresist column 60 on the photoresist layer 50.

Above are embodiments of the present invention, which does not limit the scope of the present invention. Any modifications, equivalent replacements or improvements within the spirit and principles of the embodiment described above should be covered by the protected scope of the invention.

What is claimed is:

1. An array substrate for forming a display panel, comprising:

a substrate;

a thin-film transistor disposed on the substrate, the thin-film transistor comprising a drain electrode;

a planarization layer disposed on the thin-film transistor, the planarization layer being provided with a first via hole for exposing the drain electrode;

a pixel electrode layer disposed on the surface of the planarization layer away from the substrate, the pixel electrode layer covering the first via hole and being in contact with the drain electrode; and a photoresist layer covering the pixel electrode layer, and the photoresist layer filling the first via hole which is covered with the pixel electrode layer;

wherein a common electrode layer is disposed on the planarization layer and a passivation layer is disposed on and covers the common electrode layer, wherein the passivation layer has a part extending into the first via hole formed in the planarization, the first via hole being delimited by a sidewall that is formed of a part of the planarization layer, wherein the part of the passivation layer that extends into the first via hole covers the sidewall of the first via hole and directly contacts the part of the planarization layer that defines the sidewall;

wherein the pixel electrode layer is disposed on the passivation layer and covers the passivation layer, and the pixel electrode layer is in contact with the drain electrode through the first via hole; and wherein the photoresist layer has a planar top surface that is distant from the pixel electrode layer, the planar top surface being extended to completely cover the thin-film transistor and also extended such that a photoresist column is formed on and integrally connected with the planar top surface of the photoresist layer.

2. The array substrate according to claim 1, wherein the photoresist column is used to support the display panel.

3. The array substrate according to claim 2, wherein the thin-film transistor comprises a light shielding layer disposed on the substrate, a buffer layer covering the light shielding layer, a polysilicon layer disposed on the buffer layer, and a dielectric insulating layer covering the polysilicon layer, and the dielectric insulating layer is provided with a second via hole and a third via hole, which are arranged at intervals and expose a portion of the surface of the polysilicon layer, wherein the thin-film transistor further comprises a source electrode, and the source electrode and the drain electrode are disposed on the dielectric insulating layer, and the drain electrode is in contact with the polysilicon layer through the second via hole, and the source electrode is in contact with the polysilicon layer through the third via hole, wherein the planarization layer is disposed on the source electrode, the drain electrode and the dielectric insulating layer.

4. The array substrate according to claim 3, wherein the dielectric insulating layer comprises an insulating layer and a dielectric layer stacked on the insulating layer, wherein the thin-film transistor comprises a gate electrode, the gate electrode is disposed on the insulating layer, and the dielectric layer covers the gate electrode.

5. A display panel, comprising the array substrate according to claim 1.

6. The display panel according to claim 5, wherein the photoresist column is used to support the display panel.

7. The display panel according to claim 6, wherein the thin-film transistor comprises a light shielding layer disposed on the substrate, a buffer layer covering the light shielding layer, a polysilicon layer disposed on the buffer layer, and a dielectric insulating layer covering the polysilicon layer, and the dielectric insulating layer is provided with a second via hole and a third via hole, which are arranged at intervals and expose a portion of the surface of the polysilicon layer, wherein the thin-film transistor further comprises a source electrode, and the source electrode and the drain electrode are disposed on the dielectric insulating layer, and the drain electrode is in contact with the polysilicon layer through the second via hole, and the source electrode is in contact with the polysilicon layer through the third via hole, wherein the planarization layer is disposed on the source electrode, the drain electrode and the dielectric insulating layer.

8. The display panel according to claim 7, wherein the dielectric insulating layer comprises an insulating layer and a dielectric layer stacked on the insulating layer, wherein the thin-film transistor comprises a gate electrode, the gate electrode is disposed on the insulating layer, and the dielectric layer covers the gate electrode.

9. A method for manufacturing an array substrate, comprising:
    providing a substrate;
    forming a thin-film transistor on the substrate;
    forming a planarization layer on the thin-film transistor;
    forming a first via hole in the planarization layer, the first via hole exposing a drain electrode of the thin-film transistor;
    forming a pixel electrode layer on the surface of the planarization layer away from the substrate, the pixel electrode layer covering the first via hole and being in contact with the drain electrode; and
    forming a photoresist layer on the pixel electrode layer, the photoresist layer covering the pixel electrode layer, and the photoresist layer filling the first via hole which is covered with the pixel electrode layer;
    wherein the step of forming a pixel electrode layer on the surface of the planarization layer away from the substrate comprises:
    forming a common electrode layer on the planarization layer; and
    forming a passivation layer on the common electrode layer, such that the passivation layer covers the common electrode layer, wherein the passivation layer has a part extending into the first via hole formed in the planarization, the first via hole being delimited by a sidewall that is formed of a part of the planarization layer, wherein the part of the passivation layer that extends into the first via hole covers the sidewall of the first via hole and directly contacts the part of the planarization layer that defines the sidewall;
    wherein the pixel electrode layer is formed on the passivation layer and covers the passivation layer, and the pixel electrode is in contact with the drain electrode through the first via hole;
    wherein after the step of forming a photoresist layer on the pixel electrode layer, the method further comprises forming a photoresist column on the photoresist layer; and
    wherein the photoresist layer has a planar top surface that is distant from the pixel electrode layer, the planar top surface being extended to completely cover the thin-film transistor and also extended such that the photoresist column is formed on and integrally connected with the planar top surface of the photoresist layer.

10. The method for manufacturing an array substrate according to claim 9, wherein the step of forming a thin-film transistor on the substrate comprises:
    forming a light shielding layer on the substrate;
    forming a buffer layer on the light shielding layer, and buffer layer covering the light shielding layer;
    forming a polysilicon layer on the buffer layer;
    forming a dielectric insulating layer on the polysilicon layer, the dielectric insulating layer covering the polysilicon layer; forming a second via hole and a third via hole in the dielectric insulating layer, the second via hole and the third via hole being arranged at intervals and exposing a portion of the surface of the polysilicon layer;
    forming a source electrode and a drain electrode on the dielectric insulating layer, the drain electrode being in contact with the polysilicon layer through the second via hole, and the source electrode being in contact with the polysilicon layer through the third via hole.

* * * * *